United States Patent [19]

Bruning et al.

[11] Patent Number: 5,220,590

[45] Date of Patent: Jun. 15, 1993

[54] X-RAY PROJECTION LITHOGRAPHY CAMERA

[75] Inventors: John H. Bruning, Pittsford; Anthony R. Phillips, Jr., Fairport, both of N.Y.; David R. Shafer, Fairfield, Conn.; Alan D. White, Berkeley Heights, N.J.

[73] Assignee: General Signal Corporation, Stamford, Conn.

[21] Appl. No.: 880,080

[22] Filed: May 5, 1992

[51] Int. Cl.$^5$ .............................................. G21K 5/00
[52] U.S. Cl. ....................................... 378/34; 378/145
[58] Field of Search ...................... 378/34, 84, 85, 145

[56] References Cited

FOREIGN PATENT DOCUMENTS 0252734 1/1988 European Pat. Off. .

OTHER PUBLICATIONS

"Soft x-ray reduction lithography using multilayer mirrors" by H. Kinoshita et al., J. Vac. Sci. Technol. B7(6), Nov./Dec. 1989, pp. 1648-1651.

"Reduction imaging at 14 nm using multilayer-coated optics: Printing of features smaller than 0.1 μm" by J. E. Bjorkholm et al., J. Vac. Sci. Technol. B8(6), Nov./Dec. 1990, pp. 1509-1513.

"High-Precision Soft X-Ray Optics", Proceedings of Workshop, Oct. 5-6, 1989, section on Optical Fabrication, pp. 16-20.

"Design and Analysis of Multimirror Soft-X-Ray Projection Lithography Systems" by D. L. Shealy et al., OSA Proceedings on Soft-X-Ray Projection Lithography, 1991, vol. 12, Jeffrey Bokor (ed.), Optical Society of America, pp. 22-26.

"Optics Development for Soft X-Ray Projection Lithography Using a Laser Plasma Source" by R. H. Stulen et al., Nov. 15, 1990, OSA Proceedings on Soft-X-Ray Projection Lithography, 1991, vol. 12, Jeffrey Bokor (ed.), Optical Society of America, pp. 54-57.

"Design survey of x-ray/XUV projection lithography systems" by D. L. Shealy et al., SPIE Advent Technology Series, vol. AT2, Summer/Fall 1990, (ed., Western Washingon University), SPIE Optical Engineering Press, pp. 320-331.

"Reflective systems design study for soft x-ray projection lithography" by T. E. Jewell et al., J. Vac. Sci. Technol. B8(6), Nov./Dec. 1990, American Vacuum Society, pp. 1519-1523.

"Step-and-scan lithography using reduction optics" by J. D. Buckley, J. Vac. Sci. Technol. B, vol. 7, No. 6, Nov./Dec. 1989, American Vacuum Society, pp. 1607-1612.

"20:1 Projection Soft X-ray Lithography Using Tri-level Resist" by T. E. Jewell et al., 1263-34, 5 pages.

"Optical imaging for microfabrication" by J. H. Bruning, J. Vac. Sci. Technol., 17(5), Sep./Oct. 1980, American Vacuum Society, pp. 1147-1155.

"Reflection Mask Technology for X-Ray Projection Lithography", by A. M. Hawrylak et al., presented at 33rd International Conference on Electron, Ion and Photon Beam Technology, May 31, 1989; to be published in J. Vac. Sci. Technol., Nov./Dec. 1989, pp. 1-12.

Primary Examiner—Craig E. Church
Attorney, Agent, or Firm—Eugene Stephens & Associates

[57] ABSTRACT

Optimum solutions for three-mirror lenses for projection lithography cameras using X-ray radiation to image a mask on a wafer are represented as single points within regions of two-dimensional magnification space defined by the magnification of a convex mirror as one coordinate and the ratio of the magnifications of a pair of concave mirrors optically on opposite sides of the convex mirror as another coordinate. Lenses within region 30, 50, and preferably within region 40, 60, of such magnification space represent potential solutions that are optimizable by standard computer optical design programs and techniques to achieve extremely low distortion lenses having a resolution of about 0.1 micron or less.

21 Claims, 3 Drawing Sheets

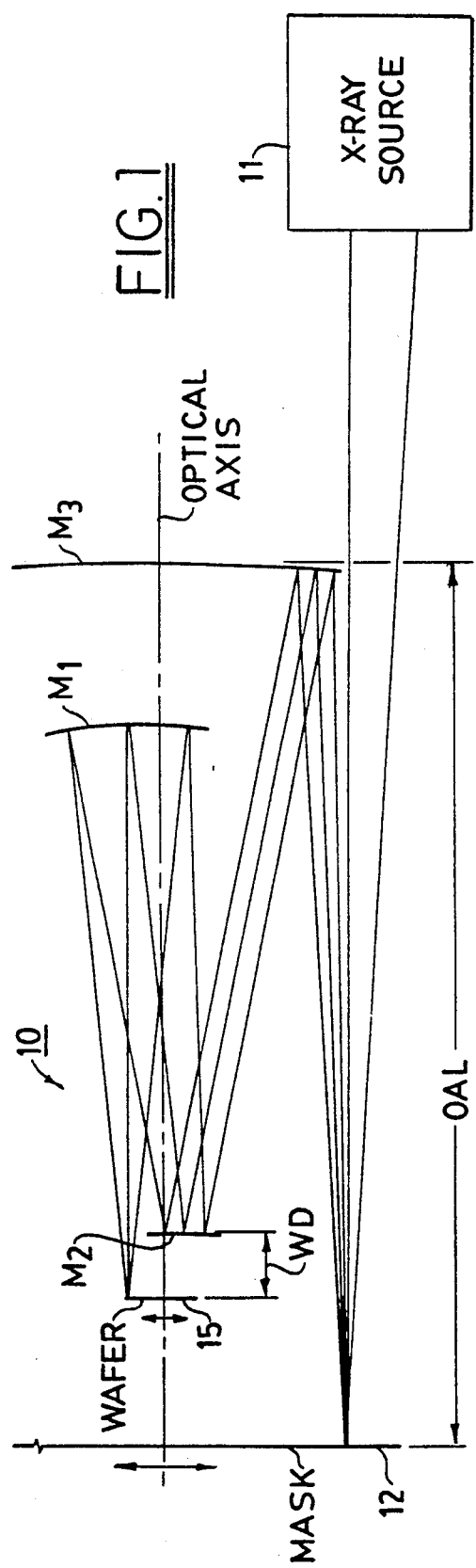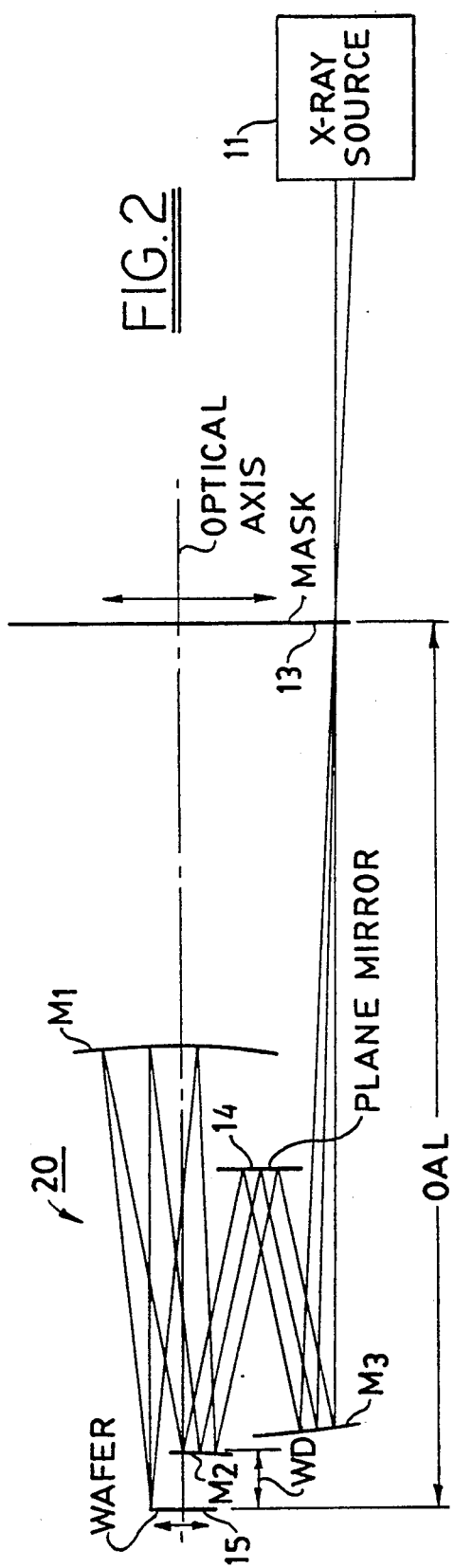

X-RAY PROJECTION LITHOGRAPHY CAMERA

BACKGROUND

A recognized way of reducing the feature size of circuit elements on microchips is to lithographically image them with radiation of a shorter wavelength. This is clear from the well-known relationship $$R = K \frac{\lambda}{NA} \quad (1)$$

where R is the resolution dimension representing feature size, K is a process-related constant of order unity, $\lambda$ is the wavelength of the radiation, and NA is the numerical aperture of the imaging system projecting the radiation onto a wafer. Shortening the wavelength $\lambda$ thus directly reduces the resolution dimension.

Enlarging the numerical aperture, as another way of reducing the resolution dimension, also reduces the depth of focus (Df), by the relationship $$Df = \frac{\lambda}{NA^2} \quad (2)$$

For several reasons, including the practical flatness of wafers, depth of focus is preferably larger than about 1.0 micron, which in turn limits the resolution improvement achievable by enlarging the numerical aperture. This leaves shortening the wavelength of the radiation as the most desirable way of improving resolution, providing ways can be found for distortion-free imaging with shorter wavelengths.

Moving down the electromagnetic spectrum to wavelengths shorter than UV radiation leads to the so-called "soft" X-ray radiation in the range of 2 to 20 nanometers wavelength. Radiation in the soft X-ray range cannot be focused refractively by passing through glass lenses, but can be focused by reflective mirrors having multilayer coated surfaces. This possibility has led to some work on soft X-ray imaging systems using mirrors in a projection imaging lens system. Examples of such work include:

- The basic problem is well explained by H. Kinoshita et al. in their paper "Soft x-ray reduction lithography using multilayer mirrors" (J. Vac. Sci. Technol. B 7 (6), Nov/Dec 1989, pages 1648–1651).
- One of the inventors of this application (J. H. Bruning) has contributed to a paper entitled "Reduction imaging at 14 nm using multilayer-coated optics: Printing of features smaller than 0.1 μm" (J. Vac. Sci. Technol. B 8 (6), Nov/Dec 1990, pages 1509–1513).
- A workshop on this subject, High-Precision Soft X-ray Optics Workshop, held Oct. 5 and 6, 1989, was sponsored by the Air Force Office of Scientific Research and the National Institute of Standards and Technology. A notebook entitled "High-Precision Soft X-Ray Optics" from this workshop includes a section on "Optical Fabrication", pages 16–20.
- The Optical Society of America sponsored a topical meeting, Soft-X-Ray Projection Lithography Topical Meeting, on Apr. 10–12, 1991. A paper entitled "Design and Analysis of Multimirror Soft-X-Ray Projection Lithography Systems", by D. L. Shealy, C. Wang, and V. K. Viswanathan, was published in OSA Proceedings on Soft-X-Ray Projection Lithography, 1991, Vol. 12, Jeffrey Bokor (ed.), Optical Society of America, pages 22–26.
- Another paper on the subject, authored by R. H. Stulen and R. R. Freeman, and entitled "Optics Using a Laser Plasma Source", dated Nov. 15, 1990, was published in OSA Proceedings on Soft-X-Ray Projection Lithography, 1991, Vol. 12, Jeffrey Bokor (ed.), Optical Society of America, pages 54–57.
- A selection of overview papers from SPIE Proceedings-Summer/Fall 1990, SPIE Advent Technology Series, Volume AT 2, (ed., Western Washington University), SPIE Optical Engineering Press, includes, at page 320, a paper entitled "Design survey of x-ray/XUV projection lithography systems", by D. L. Shealy and V. K. Viswanathan.
- Another paper entitled "Reflective systems design study for soft x-ray projection lithography" is by T. E. Jewell, J. M. Rodgers, and K. P. Thompson, and appears in J. Vac. Sci. Technol. B 8 (6), Nov/Dec 1990, American Vacuum Society, pages 1519–1523.

SUMMARY OF THE INVENTION

In our research of the optical design of mirror-based imaging systems for X-ray projection lithography cameras, we have devised a way of representing all possible three-mirror lenses with only two parameters, allowing design solutions to be graphically displayed in a comprehensive and insightful manner. The two parameters, which are the magnification of a convex mirror and the magnification ratio of two concave mirrors, can be plotted on coordinate axes in a two-dimensional magnification plane where any specific three-mirror lenses are located as points. Then using the two-dimensional magnification display to help explore the characteristics of possible design solutions, we have located and identified a region of the magnification space where optimum design solutions exist. The solutions within our region are free of many problems encountered by solutions outside our region, and our solutions generally embody practical requirements that contribute to workability. Also, our simple way of two-dimensionally representing our region of optimum solutions enables a designer to proceed more rapidly to a first-order solution and to identify first-order solutions that present the best prospects for extremely low distortion lens designs using well-known computer optimization techniques.

Although two- and four-mirror systems can be used in X-ray projection lithography cameras, we prefer three-mirror systems, with or without a fourth plane mirror for folding or turning the radiation. Three-mirror systems have been suggested for a soft X-ray projection lithography camera (published European Patent Application EP-252-734-A, entitled "X-ray Reduction Projection Exposure System of Reflection Type", of Canon KK), but the suggested systems all lie outside our region of optimum solutions. The shortcomings involved in this are explained below.

DRAWINGS

FIG. 1 is a schematic diagram of an X-ray projection lithography camera using a lens system according to our invention.

FIG. 2 is a schematic diagram of another X-ray projection lithography camera using a lens system according to our invention, including a plane folding mirror.

DETAILED DESCRIPTION

Figure 3:
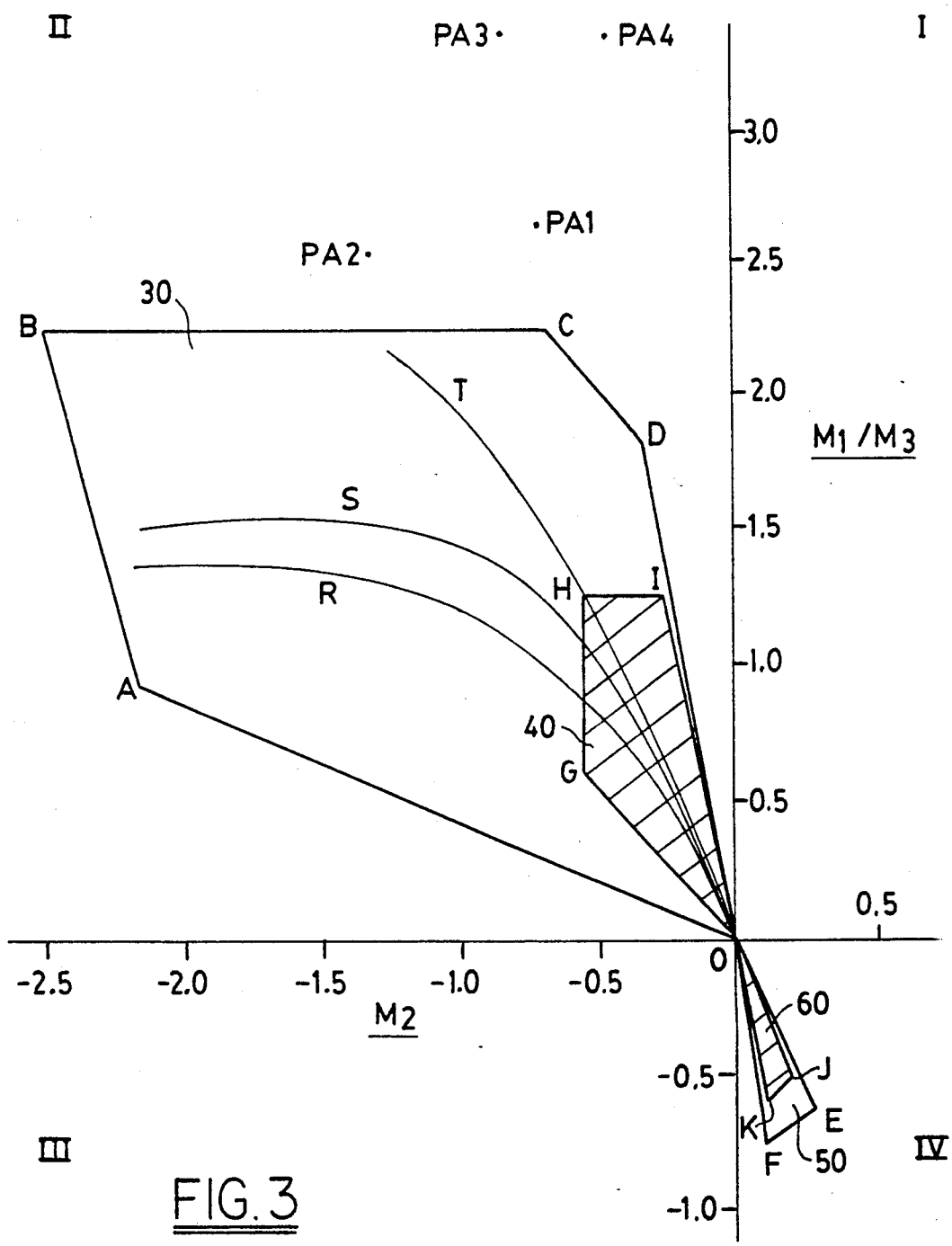
FIG. 3 is a graphic representation of regions of a magnification space in which lens systems according to our invention are located.

Any mirror based imaging system for X-ray projection lithography cameras involves variables such as surface curvatures and spacings or thicknesses between elements, which affect the performance of the final lens design. In a three-mirror system, for example, the first-order design variables include the curvatures or radii of the three mirrors and three of the spacings or thicknesses between elements (two intermirror spacings and either the object or image spacing) for a total of six variables. Graphically representing all these variables would require six-dimensional space.

We have found a way of compressing the six variables for a three-mirror system into two variables of magnification that allow a two-dimensional representation by means of a coordinate system. The two magnification variables can then be represented as coordinates along orthogonal axes lying in a two-dimensional magnification plane. This led to our discovery of a region of the magnification space that we have identified as containing optimum solutions for three-mirror systems. Before explaining in detail the optimum solution region, shown in FIG. 3, we will explain some of the terms and parameters involved.

Three-mirror Systems

Our solutions for mirror-based imaging systems for X-ray projection lithography cameras are first of all limited to three-mirror systems that place a convex mirror $M_2$ (of radius $R_2$) optically between a pair of concave mirrors $M_1$ (of radius $R_1$) and $M_3$ (of radius $R_3$), as generally shown in FIGS. 1 and 2. Four-mirror systems may also be possible; but for a number of reasons, we believe that three-mirror systems offer the best prospects. A three-mirror system can include a substantially plane folding mirror 14, such as shown in FIG. 2, however; and such a plane mirror can be arranged in many different positions for changing the direction of the image-forming radiation beam, as is generally known.

"Soft" X-ray Radiation

Our lithography camera lenses are intended for radiation in the X-ray portion of the electromagnetic spectrum, and preferably use radiation in the "soft" X-ray range of 2 to 20 nanometers wavelength. This region is chosen so that reflective mirror systems with multilayer coatings can be used with substantially normal incident radiation. The availability of good multilayer coatings and X-ray sources at 13 to 14 nanometers wavelength makes this wavelength range of particular interest in X-ray projection lithography. As schematically shown for lenses 10 and 20 of FIGS. 1 and 2, respectively, the radiation emanates from a source 11 that preferably includes a condenser. In lens 10 of FIG. 1, the radiation illuminates a reflective mask 12; and in lens 20 of FIG. 2, the radiation illuminates a transmissive mask 13. The radiation from masks 12 or 13 is then focused to form a reduced image on wafer 15 by reflection from mirrors $M_3$, $M_2$, and $M_1$ (with an additional reflection from folding mirror 14 in lens 20). The curvatures and spacings of mirrors $M_1$ through $M_3$ can be varied considerably from the approximate relationships schematically shown in FIGS. 1 and 2.

Lens Scaling and Normalization

Normalizing a lens design with respect to some linear dimension, such as focal length, for example, is a common practice in lens design work. Equivalent lenses with focal lengths differing by some scale factor, SF, from the original normalized lens of unity focal length, are then obtained by multiplying each linear dimension by SF. Scaling leaves all angles and ratios unchanged. In our investigation of three-mirror lens systems for X-ray projection lithography, we chose to use as a normalizing dimension the radius $R_2$ of the convex mirror $M_2$, which is more convenient than using focal length. Lens designs in this invention are applicable to lithography for Very Large Scale Integrated (VLSI) circuit chips with overall dimensions on the order of 1 cm or larger. The lens designs are suitable for scanning or stepping exposure methods and the appropriate scale factor would be chosen accordingly.

Total Magnification

The lens systems of interest are reduction lenses for projection lithography cameras, for which we have selected a total magnification within a range of $\frac{1}{3} \times$ to $1/10 \times$. (By the usual convention, we are omitting the minus sign that precedes these total magnification ratios.) A magnification presently used in lithography cameras is $1/5 \times$, which is familiar to workers in this art and within the range we prefer. Magnifications outside the $\frac{1}{3} \times$ to $1/10 \times$ range are possible; but for a number of reasons, we believe they are not practically desirable for projection lithography cameras. The total lens magnification is the product of the individual magnifications of each mirror:

$$mt = m_1 \times m_2 \times m_3 \qquad (3)$$

Magnification, since it is a ratio, is unchanged by scaling.

Mirror Positioning

We have also required of possible solutions that the mirrors be positioned so as to minimize interference with the radiation beam and provide space for other details of a lithography system. The disposition of the mirrors is also subject to practicalities of fabrication, mounting, and alignment.

Working Distance and Total Length

Working distance (WD in FIGS. 1 and 2) is the distance between the wafer and the $M_2$ mirror surface. Working distance provides room for adequate mirror thickness, for enclosures to permit operation in a vacuum, and for the mechanical movements that are necessary between the lens and wafer to permit various exposure modes, including stepping and scanning or a combination of both. Working distance may be stated in absolute units, but we prefer to express it in dimensionless units to allow for linear scaling of the lens. Since we chose to use the radius $R_2$ of mirror $M_2$ as a normalizing factor, as described above, in dimensionless units, we find the practical limits of the working distance WD to lie in the range of 0.05 to 0.35. Using a typical value for $R_2$ of 320 millimeters, as an example, the corresponding working distance range in absolute units becomes 16 to 112 millimeters. Longer and shorter working distances are possible, but we believe they are subject to practical difficulties that make our choice preferable.

The total or overall length of the lens system is the maximum length, including object and image planes. In FIGS. 1 and 2, for example, the overall length is the dimension OAL. We limit our lens systems to a maximum overall length of 2 meters, independent of scaling. Longer lens systems are possible, but encounter practical difficulties in keeping all elements rigidly located with respect to each other.

Chief Ray Angle at the Wafer and at the Mask

For optimum photolithographic results, the chief ray at the wafer should be telecentric, or perpendicular to the wafer surface. Departures from telecentricity of more than one or two degrees are usually unacceptable because of image displacements they cause where the wafer surface and focal plane do not coincide exactly.

For a reflective mask, the chief ray angle at the mask (CRAM) must be such that the illuminating X-ray beam incident on the mask does not interfere with the beam reflected from the mask. For most of the lens systems within our invention, sufficient clearance between the two beams is realized when the chief ray angle at the mask (measured with respect to the normal to the mask) is in the range one to eight degrees, depending on total magnification and numerical aperture, and is directed as shown in FIG. 1. With transmissive masks, such as shown in FIG. 2, the chief ray angle at the mask is less critical, and values of from +8 to −8 degrees are acceptable. Lens scaling leaves chief ray angles unchanged.

Petzval Sum and Image Field Curvature

The curvature of the image surface is proportional to the Petzval sum of the lens system. We find as a practical requirement that the Petzval sum of the lens must be substantially zero in order to meet our high resolution goal. Since the wafer surface is substantially flat, the image field must also be flat to attain good line width control in the image and maintain a large depth of focus. In terms of the curvatures of the mirrors, substantially zero Petzval sum means that the curvature of the convex mirror must be substantially equal to the sum of the curvatures of the two concave mirrors as expressed by:

$$1/R_2 \approx 1/R_1 + 1/R_3 \qquad (4)$$

When normalized with respect to the radius $R_2$ of mirror $M_2$, this expression becomes:

$$1.0 \approx R_2/R_1 + R_2/R_3 \qquad (5)$$

(All radii are considered positive quantities in equations 4 and 5.) For first-order solutions, a zero Petzval sum is used, but computer optimization of a first-order solution sometimes results in small departures of the Petzval sum from zero.

Numerical Aperture and Depth of Focus

The attainable resolution of a lens is inversely proportional to its numerical aperture, and the depth of focus is inversely proportional to the square of the numerical aperture as given in equations 1 and 2. We have restricted numerical aperture to the range 0.05 to 0.15 in order to achieve depth of focus larger than 1 micron and resolution equal to or better than 0.1 micron. Lens scaling leaves the numerical aperture unchanged and leaves the depth of focus of aberration-free lenses unchanged.

Mirror Curvature and Spacing

Surface curvatures of the mirrors, and thickness or spacing between the mirror surfaces, are parameters that determine the first-order configuration of the lens system. A total of six of these variables is involved in the design of a first-order three-mirror system, as described above. However, because we choose the Petzval sum of the lens system to be substantially zero, the curvature variables are reduced from three to two and the number of variables for the design of a three-mirror first-order system is reduced from six to five. These five variables may be effectively compressed to two variables, as described in the following section.

Magnification Space

A preliminary step in our discovery of optimum solutions for three-mirror imaging systems for X-ray projection photolithography cameras is the realization that the five variables for mirror surface curvatures and spacings can be compressed into two parameters, which can be represented in a two-dimensional magnification space, as shown in FIG. 3. Since each of the three mirrors $M_1$ through $M_3$ has associated with it a magnification involving its surface curvature and its spacing from the other mirrors and from the mask or wafer, we have found it very useful to plot the magnification $m_2$ of mirror $M_2$ along the x-axis, against the ratio of the magnifications $m_1/m_3$ of mirrors $M_1$ and $M_3$, plotted along the y-axis. In this magnification plane, three-mirror systems having particular values of total magnification mt, normalized working distance WD, and chief ray angle at the mask CRAM are represented by points along a single curved line as shown for example in FIG. 3. Three-mirror systems with different values for one or more of the parameters mt, WD, and CRAM are represented by other curved lines. In the examples presented in FIG. 3, line R represents systems with mt=¼×, WD=0.1, and CRAM=0 degrees. Line S represents systems with mt=1/5×, WD=0.15, and CRAM=0 degrees. Line T represents systems with mt=1/5×, WD=0.15, and CRAM=3 degrees. At any point along each line, all the first-order curvature and spacing parameters for a normalized three-mirror system with zero Petzval sum are determinable. Compressing the five independent variables associated with a three-mirror system into two-dimensional magnification space systematizes and expedites the search for new first-order lens designs potentially capable of meeting our performance criteria. It also leads to our discovery and mapping of boundaries for a specific region in magnification space where optimum solutions lie, as represented in FIG. 3.

Optimum Region of Magnification Space

The magnification space region containing our optimum lens solutions, as shown in FIG. 3, is divided into zones 30, 40, 50, and 60, which are bounded by straight lines that intersect the origin at 0,0 and are restricted to the second and fourth quadrants. The second quadrant region 40 is a preferred subregion of the larger region 30; and similarly, the fourth quadrant region 60 is a preferred subregion of the larger region 50. In the second quadrant regions 30 and 40, $m_2$ is negative; and, since the total lens magnification mt is also negative (i.e., the final image is real and inverted), the magnifications $m_1$ and $m_3$ must have the same sign. For fourth quadrant solutions, where $m_2$ is positive (implying an image that is virtual and non-inverted), the magnifications $m_1$ and $m_3$ must have opposite signs in order to make the total magnification negative.

The boundaries of region 30, 50 are formed by lines through points 0, A, B, C, D, 0, E, F, 0. The coordinates for these points are as shown in the following table:

| Magnification Space Region 30, 50 | | |
| --- | --- | --- |
| point | $m_2$ | $m_1/m_3$ |
| 0 | 0 | 0 |
| A | −2.13 | +0.925 |
| B | −2.50 | +2.24 |
| C | −0.67 | +2.24 |
| D | −0.325 | +1.80 |
| 0 | 0 | 0 |
| E | +0.27 | −0.62 |
| F | +0.10 | −0.75 |
| 0 | 0 | 0 |

The preferred subregion 40, 60 is bounded by lines through points 0, G, H, I, 0, J, K, 0. The coordinates for these points are shown in the following table:

| Preferred Subregion 40, 60 | | |
| --- | --- | --- |
| point | $m_2$ | $m_1/m_3$ |
| 0 | 0 | 0 |
| G | −0.55 | +0.623 |
| H | −0.55 | +1.25 |
| I | −0.25 | +1.25 |
| 0 | 0 | 0 |
| J | +0.220 | −0.50 |
| K | +0.10 | −0.60 |
| 0 | 0 | 0 |

Three-mirror imaging systems for X-ray projection lithography cameras can lie outside our magnification space region 30, 50; but the evidence we have accumulated indicates that such outside solutions are unlikely to achieve the required fine resolution and low distortion or are otherwise not likely to meet the practical requirements explained above. There may also exist first-order solutions within our region 30, 50 which are not correctable; but our accumulated evidence indicates that the best prospects for optimum solutions lie within the magnification region we have identified. Having this region available can significantly expedite the lens design process necessary to reach the performance goal within the practical requirements explained above.

Any three-mirror lens system for projection lithography can be represented by a point somewhere within the overall magnification space shown in FIG. 3; and points falling within region 30, 50 represent potentially optimum solutions, many of which we have found to be correctable to a very high degree, using computer optimization programs. Workers skilled in the use of these programs, which lead to small modifications in the first-order solutions, can achieve corrected lens systems having very fine resolution and very low distortion. The modifications from computer optimization can involve parameters such as small changes in the basic spherical form of one or more mirrors by incorporation of aspheric and conic terms, small tilts or decenterings, small changes in one or more first-order radii and spacings, and small changes in working distance WD or CRAM. The modifications can move the first-order solution point slightly in magnification space, and the modifications can lead to a number of slightly different lenses occupying the same point in magnification space.

Systems lying outside region 30, 50 suffer from one or more of the following problems, depending on where they lie relative to the boundaries of region 30, 50: overall length more than 2 meters; insufficiently large correctable aperture resulting in unacceptably low resolution; beam interference resulting from small inter-mirror spacing; too small a working distance; a chief ray angle at the mask that is too small or is inclined in the wrong direction, leading to beam interference when reflective masks are used, or is too large, leading to excessive distortion in the projected image; a total magnification mt that is outside the range $\frac{1}{3}$X to 1/10X; or mirror configurations that are not easily fabricated or aligned.

Some of these shortcomings tend to occur along specific portions of the boundaries of region 30, 50. For example, outside the 0-A and 0-E boundaries, the total magnification tends to become larger than $\frac{1}{3}$X; outside the 0-D-C and 0-F boundaries, the total magnification tends to become smaller than 1/10X; and outside the 0-D and 0-E boundaries, the chief ray angle at the mask becomes too large and distortion becomes intolerably large. The corner points A, B, C, and D have been set by exploring limiting cases for $\frac{1}{3}$X, 1/5X, 1/7.5X, and 1/10X, respectively, and the corner points E and F by similarly exploring limiting cases in the fourth quadrant for $\frac{1}{3}$X and 1/10X. The important case of 1/5X is well within the boundaries of the 30, 50 region, as are intermediate magnifications between the extremes of $\frac{1}{3}$X and 1/10X. Lenses with a specific total magnification, mt, normalized working distance, WD, and chief ray angle at the mask, CRAM, lie along a line as described in the paragraph headed Magnification Space, and as illustrated in FIG. 3. Cross-hatched subregion 40, 60 within overall region 30, 50 is especially likely to contain optimum solutions; and the 0, G, H, I, J, K points at the corners of region 40, 60 are based on computer exploration of the overall region 30, 50. In effect, region 40, 60 is especially rich in potential optimum solutions, although these can occur outside region 40, 60 but within overall region 30, 50.

The prior art suggestions for three-mirror imaging systems for X-ray projection photolithography cameras (disclosed in Canon KK published European Application EP-252-734-A cited above) include examples 1-8 through 1-15 which are plotted on the magnification plane of FIG. 3 and which all lie in the second quadrant outside of our optimum solution region 30. These are marked as points PA1-PA4 and relate to the examples in the '734 application as follows:

| Points | Examples | mt | $m_2$ | $m_1/m_3$ | NA | WD |
| --- | --- | --- | --- | --- | --- | --- |
| PA1 | 1-8 | 1/5x | −0.710 | 2.627 | 0.0167 | 0.627 |
|  | 1-9 | 1/5x | −0.710 | 2.627 | 0.0167 | 0.627 |
|  | 1-10 | 1/5x | −0.710 | 2.627 | 0.0167 | 0.627 |
| PA2 | 1-11 | 1/5x | −1.322 | 2.513 | 0.038 | 0.468 |
|  | 1-12 | 1/5x | −1.322 | 2.513 | 0.038 | 0.468 |
|  | 1-13 | 1/5x | −1.319 | 2.518 | 0.038 | 0.469 |
| PA3 | 1-14 | 1/2x | −0.844 | 3.352 | 0.019 | 1.472 |
| PA4 | 1-15 | 1/1x | −0.459 | 3.346 | 0.012 | 2.567 |

All of these prior art examples involve numerical apertures of 0.038 or smaller, which we regard as too small to meet the 0.1 micron resolution goal, and have normalized working distances WD greater than 0.35, which we regard as too large. Also, some have overall lengths in excess of 2 meters, or total magnifications in excess of ⅛×.

Figure 4:
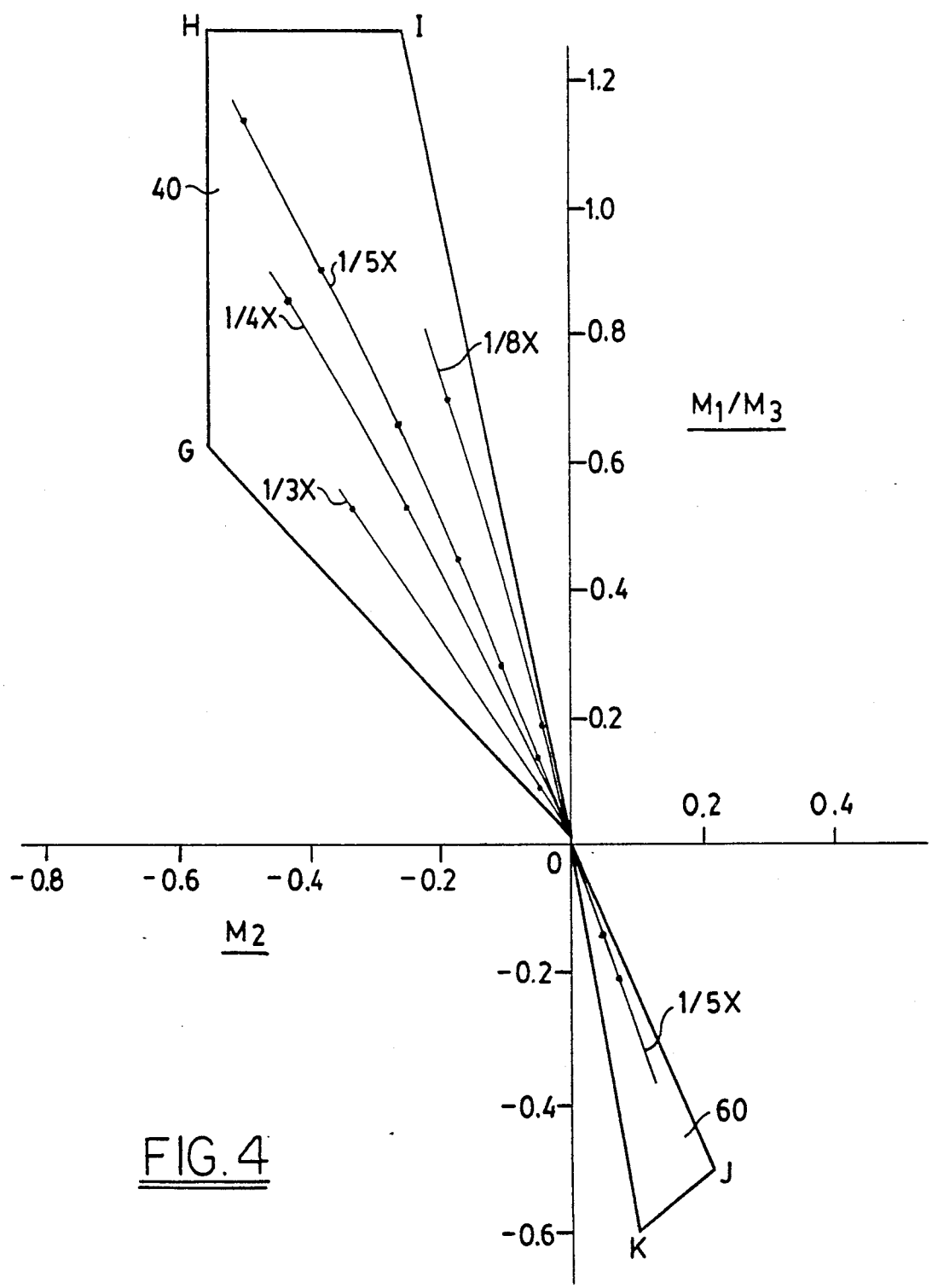
FIG. 4 is an enlargement of a central portion of FIG. 3, showing the locations in magnification space of some preferred embodiments of lenses according to our invention.

FIG. 4, which is an enlargement of the region 40, 60 of FIG. 3, also shows the location in our preferred region of magnification space of a few of the examples we have found to be optimum solutions. These points are represented in the following table and are shown as points along total magnification lines drawn on FIG. 4. In the table (as elsewhere in this application), mt is the total magnification, $m_2$ is the magnification of mirror $M_2$, $m_1/m_3$ is the ratio of magnifications of $M_1$ and $M_3$, WD is the normalized working distance, OAL is the total length in meters, and $R_2$ is the radius of mirror $M_2$ in millimeters. All examples have the same numerical aperture, 0.1, and therefore the same depth of focus.

|      | mt   | $m_2$  | $m_1/m_3$ | WD     | OAL   | $R_2$   |
|------|------|--------|-----------|--------|-------|---------|
| EX1  | 1/3× | −0.331 | +0.532    | 0.0913 | 1.248 | 451.02  |
| EX2  | 1/3× | −0.045 | +0.086    | 0.1409 | 0.624 | 322.47  |
| EX3  | 1/4× | −0.434 | +0.854    | 0.1718 | 1.088 | 325.38  |
| EX4  | 1/4× | −0.243 | +0.526    | 0.1575 | 0.858 | 323.48  |
| EX5  | 1/4× | −0.026 | +0.066    | 0.1727 | 0.572 | 328.87  |
| EX6  | 1/5× | −0.513 | +1.155    | 0.1825 | 1.480 | 321.28  |
| EX7  | 1/5× | −0.380 | +0.903    | 0.1536 | 1.268 | 322.61  |
| EX8  | 1/5× | −0.260 | +0.660    | 0.1528 | 1.105 | 322.65  |
| EX9  | 1/5× | −0.166 | +0.444    | 0.1474 | 0.943 | 321.82  |
| EX10 | 1/5× | −0.037 | +0.113    | 0.1817 | 0.729 | 319.45  |
| EX11*| 1/5× | +0.047 | −0.138    | 0.1135 | 0.737 | 462.31  |
| EX12 | 1/5× | +0.096 | −0.283    | 0.0954 | 0.887 | 691.60  |
| EX13 | 1/8× | −0.185 | +0.695    | 0.1039 | 1.455 | 307.52  |
| EX14 | 1/8× | −0.048 | +0.193    | 0.0754 | 0.990 | 359.22  |

Examples 1–10, 13, and 14 are in the second quadrant region 40; and examples 11 and 12 are in the fourth quadrant region 60. Example 11 (noted with an *) is a particularly well-corrected lens.

We claim:

1. A projection lithography camera having a source of X-ray radiation, a wafer, a lens, and a mask to be imaged on said wafer, said lens having a convex mirror $M_2$ arranged optically between concave mirrors $M_1$ and $M_3$ to form an imaging system, said lens being represented by a single point in two-dimensional magnification space defined by coordinates:

$m_2$ = magnification of mirror $M_2$ and $$\frac{m_1}{m_3} = \frac{\text{magnification of mirror } M_1}{\text{magnification of mirror } M_3}$$

and
said point for said lens lies within an area of said magnification space bounded by lines through points 0, A, B, C, D, 0, E, F, 0 having the following coordinates:

| point | $m_2$  | $m_1/m_3$ |
|-------|--------|-----------|
| 0     | 0      | 0         |
| A     | −2.13  | +0.925    |
| B     | −2.50  | +2.24     |
| C     | −0.67  | +2.24     |
| D     | −0.325 | +1.80     |
| 0     | 0      | 0         |

-continued

| point | $m_2$  | $m_1/m_3$ |
|-------|--------|-----------|
| E     | +0.27  | −0.62     |
| F     | +0.10  | −0.75     |
| 0     | 0      | 0         |

2. The camera of claim 1 wherein said point for said lens lies within a subregion of said magnification space bounded by lines through points 0, G, H, I, 0, J, K, 0 having the following coordinates:

| point | $m_2$  | $m_1/m_3$ |
|-------|--------|-----------|
| 0     | 0      | 0         |
| G     | −0.55  | +0.623    |
| H     | −0.55  | +1.25     |
| I     | −0.25  | +1.25     |
| 0     | 0      | 0         |
| J     | +0.220 | −0.50     |
| K     | +0.10  | −0.60     |
| 0     | 0      | 0         |

3. The camera of claim 1 including a plane mirror.

4. The camera of claim 1 wherein said mirror $M_1$ is optically between said mirror $M_2$ and said wafer, and said mirror $M_3$ is optically between said mirror $M_2$ and said mask.

5. The camera of claim 1 wherein the normalized curvatures of the surfaces of said mirrors $M_1$, $M_2$, and $M_3$ and the normalized spaces between said mirrors $M_1$–$M_2$, and $M_2$–$M_3$ are derivable from said coordinates of said point, after selecting for said lens a total magnification, a normalized working distance, and a chief ray angle at said mask.

6. The camera of claim 5 wherein said chief ray angle at said mask is less than 8° from the normal to the mask.

7. The camera of claim 1 wherein said chief ray angle at said wafer is less than 2° from the normal to the wafer.

8. The camera of claim 1 wherein said mirror $M_1$ has a radius $R_1$, said mirror $M_2$ has a radius $R_2$, and said mirror $M_3$ has a radius $R_3$, and the radii of said mirrors, as positive terms, satisfy the inequality $$0.95 < \left( \frac{R_2}{R_1} + \frac{R_2}{R_3} \right) < 1.05$$

9. The camera of claim 1 wherein the Petzval sum of the lens is substantially zero.

10. The camera of claim 1 wherein a numerical aperture for said lens has a value of 0.05 to 0.15.

11. The camera of claim 1 wherein a working distance for said lens, normalized with respect to a radius of said mirror $M_2$, has a value of 0.05 to 0.35.

12. A camera for X-ray projection lithography, said camera having a source of X-ray radiation directed from a mask through an imaging system to a wafer so that the mask is imaged on the wafer, said imaging system being formed of a pair of concave mirrors optically on opposite sides of a convex mirror arranged to be represented by a point in a region of two-dimensional magnification space defined by the magnification of said convex mirror as one coordinate and a ratio of the magnifications of said concave mirrors as another coordinate, said region of said magnification space containing said point being bounded by lines through points 0, A, B, C, D, 0, E, F, 0 having the following coordinates:

| point | magnification of convex mirror | ratio of magnifications of concave mirrors |
| --- | --- | --- |
| 0 | 0 | 0 |
| A | −2.13 | +0.925 |
| B | −2.50 | +2.24 |
| C | −0.67 | +2.24 |
| D | −0.325 | +1.80 |
| 0 | 0 | 0 |
| E | +0.27 | −0.62 |
| F | +0.10 | −0.75 |
| 0 | 0 | 0 | wherein said mirror $M_1$ has a radius $R_1$, said mirror $M_2$ has a radius $R_2$, and said mirror $M_3$ has a radius $R_3$, and the radii of said mirrors, as positive terms, satisfy the inequality $$0.95 < \left( \frac{R_2}{R_1} + \frac{R_2}{R_3} \right) < 1.05$$

13. The camera of claim 12 wherein said region of said magnification space containing said point is within a subregion bounded by lines through points 0, G, H, I, 0, J, K, 0 having the following coordinates:

| point | magnification of convex mirror | ratio of magnifications of concave mirrors |
| --- | --- | --- |
| 0 | 0 | 0 |
| G | −0.55 | +0.623 |
| H | −0.55 | +1.25 |
| I | −0.25 | +1.25 |
| 0 | 0 | 0 |
| J | +0.220 | −0.50 |
| K | +0.10 | −0.60 |
| 0 | 0 | 0 |

14. The camera of claim 12 including a plane mirror.

15. The camera of claim 12 wherein said ratio of the magnifications of said concave mirrors comprises the magnification of the one of said concave mirrors optically on the wafer side of said convex mirror divided by the magnification of the one of said concave mirrors optically on the mask side of said convex mirror.

16. The camera of claim 12 wherein the normalized curvatures of the surfaces of said mirrors $M_1$, $M_2$, and $M_3$ and the normalized spaces between said mirrors $M_1$-$M_2$, and $M_2$-$M_3$ are derivable from said coordinates of said point, after selecting for said lens a total magnification, a normalized working distance, and a chief ray angle at said mask.

17. The camera of claim 16 wherein said chief ray angle at said mask is less than 8° from the normal to the mask.

18. The camera of claim 12 wherein said chief ray angle at said wafer is less than 2° from the normal to the wafer.

19. The camera of claim 12 wherein the Petzval sum of the lens is substantially zero.

20. The camera of claim 12 wherein a numerical aperture for said lens has a value of 0.05 to 0.15.

21. The camera of claim 12 wherein a working distance for said lens, normalized with respect to a radius of said mirror $M_2$ has a value of 0.05 to 0.35.

* * * * *